(12) United States Patent
Johnson et al.

(10) Patent No.: US 8,653,434 B2
(45) Date of Patent: Feb. 18, 2014

(54) AVALANCHE PHOTODIODE OPERATING VOLTAGE SELECTION ALGORITHM

(75) Inventors: Aaron Johnson, Merrimack, NH (US); David Schorr, Austin, TX (US); James H. Steenson, Jr., New Boston, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 243 days.

(21) Appl. No.: 13/377,084

(22) PCT Filed: Apr. 8, 2011

(86) PCT No.: PCT/US2011/031679
§ 371 (c)(1),
(2), (4) Date: Dec. 8, 2011

(87) PCT Pub. No.: WO2011/127343
PCT Pub. Date: Oct. 13, 2011

(65) Prior Publication Data
US 2012/0080583 A1    Apr. 5, 2012

Related U.S. Application Data

(60) Provisional application No. 61/321,969, filed on Apr. 8, 2010.

(51) Int. Cl.
*G01J 1/44* (2006.01)

(52) U.S. Cl.
USPC .................. 250/214 R; 250/214.1; 327/422; 327/514

(58) Field of Classification Search
USPC ...... 250/214 R, 214.1, 214 VT, 214 AG, 207; 327/422, 514; 257/186
See application file for complete search history.

(56) References Cited

U.S. PATENT DOCUMENTS

| 4,945,227 | A  | * | 7/1990 | Jones et al. | 250/214 R |
| 6,541,752 | B2 | * | 4/2003 | Zappa et al. | 250/214.1 |
| 7,897,906 | B2 | * | 3/2011 | Deschamps | 250/214 R |
| 2001/0020673 | A1 | | 9/2001 | Zappa et al. | |
| 2007/0200141 | A1 | | 8/2007 | Ishibashi et al. | |
| 2009/0020782 | A1 | | 1/2009 | Pan et al. | |

FOREIGN PATENT DOCUMENTS

JP    2004-031707    1/2004

* cited by examiner

*Primary Examiner* — Kevin Pyo
(74) *Attorney, Agent, or Firm* — Daniel J. Long; Maine Cernota & Rardin

(57) ABSTRACT

An accurate and rapid method for characterizing the performance of an APD and setting its operating voltage Vop to an optimal value uses an on-board LED or other pulsed light source to measure APD responses at different operating voltages Vop. An estimated breakdown voltage Vb is determined by comparing the measured responses, and the Vop is adjusted to a new value at a fixed offset from the estimated Vb. The fixed offset is selected according to ambient light conditions, including the presence or absence of light background noise, and whether the sun is partially or fully in the field of view. The method is iterated until convergence, or until a maximum number of iterations is reached. In embodiments, a plurality of APD's having a common Vop can be adjusted, and the Vop is never set below a minimum value VopBW necessary to meet timing requirements for a missile guidance system.

19 Claims, 4 Drawing Sheets

AVALANCHE PHOTODIODE OPERATING VOLTAGE SELECTION ALGORITHM

RELATED APPLICATIONS

This application claims the benefit of U.S. Provisional Application No. 61/321,969, filed Apr. 8, 2010, herein incorporated by reference in its entirety for all purposes.

STATEMENT OF GOVERNMENT INTEREST

The invention was made with United States Government support under Contract No. W31P4Q-06-C-0330 awarded by the Navy. The United States Government has certain rights in this invention.

FIELD OF THE INVENTION

The invention relates to methods for setting the operating voltage (Vop) of an avalanche photodiode (APD), and more particularly to automated methods for setting the APD operating voltage in any application where the performance of the system depends strongly on the signal-to-noise performance (S/N) and/or the Responsivity-to-Noise ratio (R/N) of the APD.

BACKGROUND OF THE INVENTION

An avalanche photodiode (APD) is a highly sensitive semiconductor electronic device that exploits the photoelectric effect to convert light to electricity. APD's can be thought of as photo-detectors that provide a built-in first stage of gain through avalanche multiplication. From a functional standpoint, APD's can be regarded as the semiconductor analog to photomultipliers.

Upon application of a reverse bias "operating voltage" (Vop), APD's show an internal current gain effect due to impact ionization (avalanche effect). In general, the higher the reverse voltage, the higher the gain. A "trans-impedance amplifier" (TIA) can then be used to convert this current effect to a voltage effect.

APD's are frequently used in LASER range finders, which transmit pulses of LASER light and then detect the light echo which is reflected from a remote object. By measuring the time delay between pulse transmission and echo detection, the distance to the reflecting object can be calculated. APD's are also used in missile guidance systems, and in many other applications where the performance of the system depends strongly on the signal-to-noise performance (S/N) and/or the Responsivity-to-Noise ratio (R/N) of the APD's.

The performance of an APD-based system typically depends on the performance of the APD itself. In the absence of ambient light "noise" and impinging sunlight, optimal performance will be achieved when the Vop is adjusted such that the total APD noise is equal to the amplifier noise. In the absence of ambient light, the optimal Vop will be close to the maximum, or "breakdown" voltage (Vb) of the APD. In the presence of background light noise and/or sunlight, optimal performance will result when the Vop is set to a lower value. There is a lower voltage limit VopBW at which the APD might not meet the timing (bandwidth) required to evaluate the laser pulses.

APD's experience significant performance changes as a function of temperature, including changes to Vb and VopBW. In addition, the system level manufacturing process typically adds additional variation from one part to the next. These variations in APD characteristics can result in extreme performance variations unless compensating adjustments are made to the operating voltage of the APD (Vop). Therefore, optimal performance can only be achieved if the electronic performance of the APD is characterized and the Vop is adjusted accordingly. Depending on the operating conditions, it may be necessary to repeat this Vop adjustment as the temperature changes, and/or as background light "noise" and impinging sun conditions change. If the Vop of a plurality of APD's is provided by a common power supply, it is necessary to characterize each of the APD's and set the Vop to a value which will be optimal for the entire group.

APD's are sometimes used in missile guidance systems, such as the guidance system of the APKWS missile. In such cases, it can be necessary to periodically characterize and adjust the Vop for all onboard APD's during the flight of the missile, as light and temperature conditions change. In addition, it can be necessary to perform the characterizations and adjustments quickly, since frequent measurements are required and the missile travels very rapidly. In particular, the APKWS includes seven APD's, each of which must/be characterized before the Vop can be adjusted. A typical requirement is that an entire set of APD's must be characterized and the Vop adjusted in less than 300 ms.

Vop characterization methods typically require multiple sequential background-noise measurements so as to determine an acceptable Vop voltage. These algorithms have typically been loosely tied to the APD manufacturer's specifications, and have not always met the specified bandwidth requirement. For systems that include a plurality of APD's sharing a common Vop, these algorithms have typically required a detailed systems analysis to evaluate how the Vop should be set. In particular, these methods typically require that the breakdown voltages of each of the APD's be determined so as to find the optimal Vop solution. As a result, such characterization and adjustment methods can be time consuming and are not always optimal.

What is needed, therefore, is a method for rapidly and accurately determining the performance characteristics of one or more avalanche photo diodes (APD's), and selecting an optimal operating voltage (Vop) for the APD's.

SUMMARY OF THE INVENTION

The method of the present invention uses at least one onboard LED to characterize the performance of at least one APD, for example during initialization of the APD and/or periodically during use of the APD. This approach eliminates the need for additional testing of the APD during the manufacturing process, and allows the APD performance to be quickly and frequently optimized by adjusting the APD bias voltage.

The method of the present invention exposes the APD to a pulsed light source, which in various embodiments is an LED. The method then applies an iterative procedure that characterizes each APD by adjusting its bias voltage Vop and evaluating the resulting change in its response to the repeatable, amplitude pulsed light source. The data thus acquired is evaluated with reference to environmental factors such as the ambient light level, whether the sun is in the field of view, and the ambient temperature, and the optimal operating voltage (Vop) for the APD(s) is determined.

Specifically, the method of the invention includes comparing APD responses obtained at a current Vop and at a previous Vop, estimating the breakdown voltage(s) (Vb) according to the comparison, and then setting the Vop to a new value which is at a fixed offset below the lowest estimated Vb. The fixed offset is selected according to operating conditions, such as the presence or absence of ambient light "noise" and/or impinging sunlight. This procedure is repeated iteratively, each time comparing the response at the updated Vop with the response at the previous Vop, until a convergence criterion is met or a maximum number of iterations is reached. In some embodiments, the convergence criterion is a change in Vop of less than 5 Volts, and/or the maximum number of iterations is 5.

The driving factor in the method of the present invention is optimization of the Signal-to-Noise ratio (R/N) and/or Responsivity-to-Noise ratio (R/N) across all included APD's.

The present invention is a method for optimizing the operating voltage Vop of an avalanche photo-diode (APD). The method includes setting Vop to a first value which is less than an initially estimated breakdown voltage for the APD, determining a first response of the APD to an on-board light source at the first Vop value, setting Vop to an updated value which is less than the initially estimated breakdown voltage and different from the previous value of Vop, determining an updated response of the APD to the on-board light source, determining an updated estimated breakdown voltage according to the updated value of Vop, the updated response, the immediately previous value of Vop, and the immediately previous response, setting Vop to an offset value which is offset below the updated estimated breakdown voltage by a fixed offset amount, and repeating the steps of determining an updated response, determining an updated estimated breakdown voltage, and setting the Vop to an offset value, until at least one of a convergence criterion is met and a maximum number of repetitions is reached, each estimated breakdown voltage being determined according to a most recently set value of Vop, a most recent response, an immediately previous value of Vop, and an immediately previous response.

In embodiments, determining the updated estimated breakdown voltage Vb includes applying the formula $$Vb=(R2*Vop2-R1*Vop1)/(R2-R1)$$

where Vop1 is the immediately previous value of Vop, R1 is the response of the APD for Vop=Vop1, Vop2 is the updated value of Vop, and R2 is the response of the APD for Vop=Vop2.

In some embodiments, the initially estimated breakdown voltage is estimated according to an ambient temperature and typical characteristics applicable to an APD type to which the APD belongs.

In other embodiments, the method further includes determining a field of view illumination status, and the fixed offset amount is determined according to the field of view illumination status.

In various embodiments the field of view illumination status is selected from among a group of status conditions, the group of status conditions including night, day, sun not in field of view, day, sun partially in field of view, and day, sun fully in field of view. In some of these embodiments the fixed offset amount for a field of view illumination status of "night" is about approximately 40 volts. In other of these embodiments the fixed offset amount for a field of view illumination status of "day, sun not in field of view" is about approximately 80 volts. In still other of these embodiments the fixed offset amount for a field of view illumination status of "day, sun partially in field of view" is an amount which sets Vop to a minimum value VopBW below which the response of the APD might not meet a timing (bandwidth) required to evaluate laser pulses. And in yet other of these embodiments the fixed offset amount for a field of view illumination status of "day, sun fully in field of view" is an amount which sets Vop to a minimum value VopBW below which the response of the APD might not meet a timing (bandwidth) required to evaluate laser pulses.

In various embodiments the convergence criterion is that the difference between the updated value of Vop and the immediately previous value of Vop is less than or equal to 5 Volts in one embodiment. And in some embodiments the maximum number of repetitions is 5 repetitions.

In certain embodiments the fixed offset is adjusted if necessary so as to ensure that Vop is not set below a minimum value VopBW necessary to meet timing requirements of the APD.

In some embodiments the on-board light source is an LED.

In various embodiments a common Vop is provided to each APD in a group containing a plurality of APD's, and the method further includes determining responses of each of the APD's in the group to the on-board light source and setting the Vop to a value which is optimal for performance of the group of APD's. In some of these embodiments determining responses of each of the APD's in the group to the on-board light source includes determining responses of each of the APD's to the same on-board light source. In other of these embodiments the group includes exactly seven APD's.

In still other of these embodiments setting the Vop to a value which is optimal for performance of the group of APD's includes determining a most sensitive APD in the group, the most sensitive APD in the group being that APD in the group which has the lowest breakdown voltage in comparison to the other APD's in the group, optimizing Vop to find an optimal value VopMS for the most sensitive APD in the group, and setting Vop to a value which is offset from VopMS by a predetermined most-sensitive offset amount. and in some of these embodiments setting Vop to a value which is offset from VopMS includes setting Vop to a value which is greater than a minimum value VopBW below which the updated response of the APD to the on-board light source cannot be determined within a specified maximum time period.

And in various embodiments the on-board light source is a pulsed light source.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION

The present invention is a method for characterizing the performance of at least one avalanche photo-diode, or "APD," and determining therefrom an optimal operating voltage (Vop). The method of the present invention uses at least one on-board light source, which in some embodiments is an LED, and in some embodiments is a pulsed light source, to characterize the APD, for example during initialization of the APD and/or periodically during use of the APD. This approach eliminates the need for additional testing of the APD during the manufacturing process, and allows the APD performance to be quickly optimized by adjusting the APD bias voltage.

Figure 1:
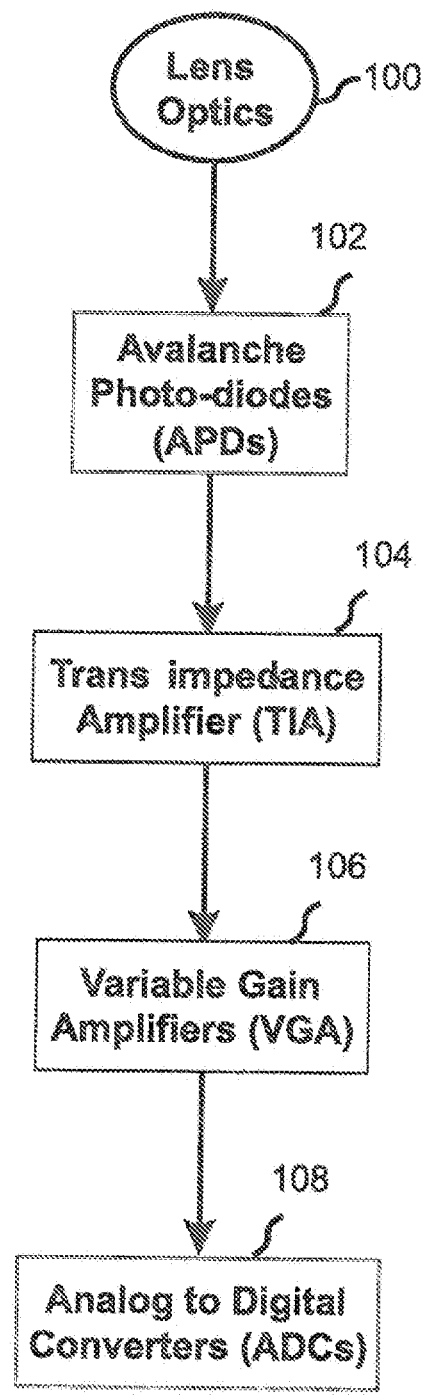
FIG. 1 is a block diagram illustrating the components of a typical APD-based missile guidance system.

APD's are frequently used in LASER range finders, missile guidance systems, and many other applications which require high APD signal-to-noise ratio and/or responsitivity-to-noise ratio. FIG. 1 illustrates a typical configuration for the light detecting portion of APD-based missile guidance system. LASER light reflected from an external object is focused by a lens 100 onto an APD 102, which detects the light and responds with an amplified current output. A trans-impedance amplifier, or "TIA" 104, converts the output current from the APD 102 into a voltage which is proportional to the amount of light energy impacting the APD 102. The output from the TIA 104 is then amplified by a variable gain amplifier, or "VGA" 106 and converted to a digital result by an analog-to-digital converter 108.

The VGA 106 is typically AC-coupled to the TIA 104, so that any DC offset from the TIA 104 is not detected. An excess of light, for example due to bright overall sunlight and/or due to the sun being at least partly in the field of view, will typically cause the TIA 104 to have a large DC offset, and may even cause the TIA 104 to saturate. Due to the AC coupling of the TIA 104 to the VGA 106, this saturation may not be readily detected. Therefore, it is highly important that the Vop of the APD 102 be adjusted to a value that is appropriate for the ambient light conditions.

Figure 2:
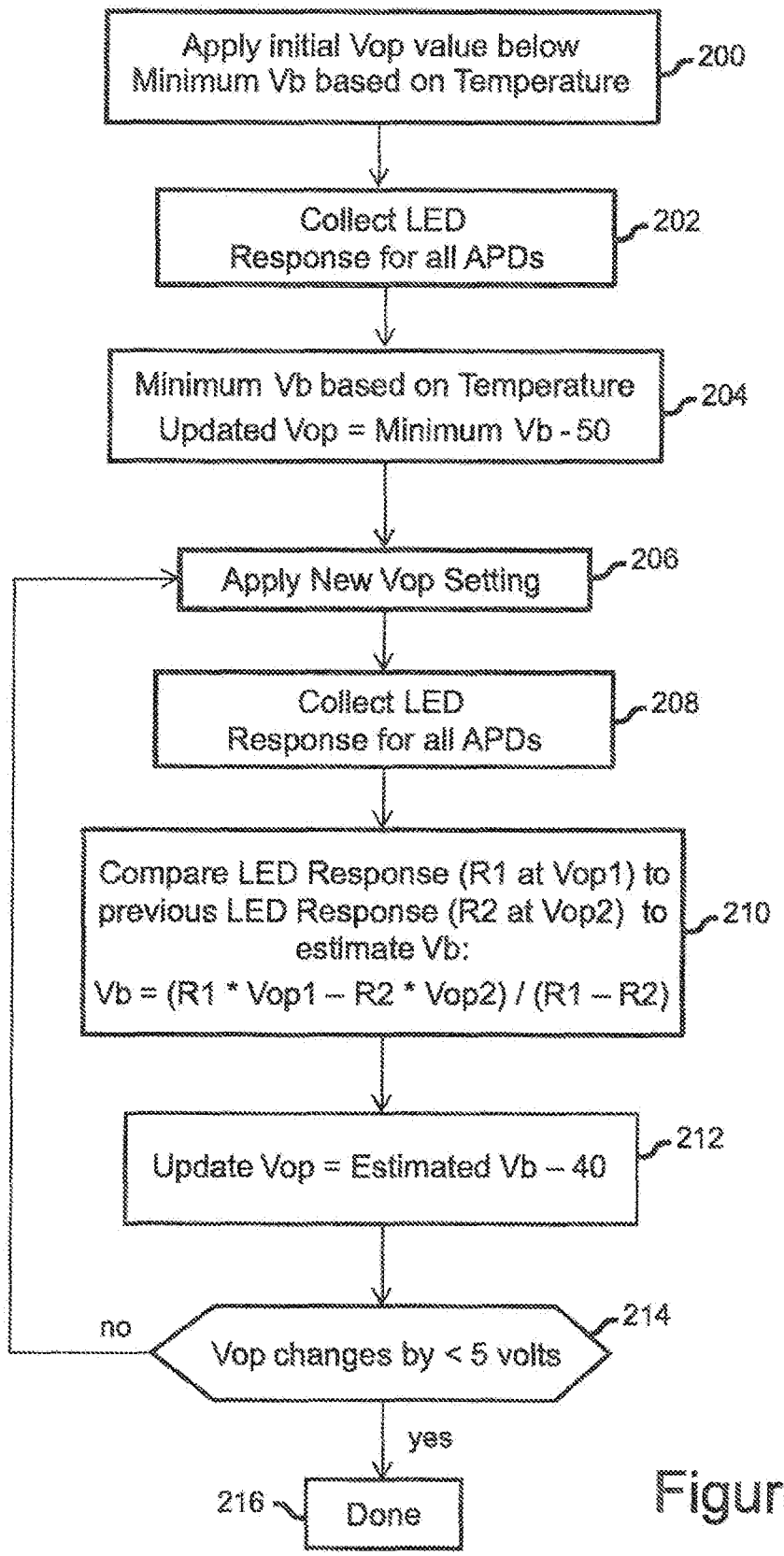
FIG. 2 is a flow diagram of an embodiment of the present invention.

An embodiment of the present invention which includes seven APD's is illustrated in the flow diagram of FIG. 2. The embodiment begins 200 by setting the Vop to an initial value which is less than an initially estimated minimum breakdown voltage Vb. In some embodiments, the initially estimated minimum breakdown voltage is determined according to the ambient temperature and the manufacturer's specifications for the particular type of APD 204. APD responses are then collected 202 from all seven APD's using a pulsed LED included in the system. In similar embodiments, other types of pulsed light sources are used. The Vop is set to a value which is a fixed offset below the initially estimated Vb 204. In the embodiment of FIG. 2, the fixed value is 50 Volts. Then readings are once again collected for all seven APD's using the LED 208.

The two sets of APD response data are then compared, and a revised Vb is calculated 210 according to the formula $$Vb=(R1*Vop1-R2*Vop2)/(R1-R2),\quad(1)$$

where R1 is the response measured for the first voltage setting Vop1, and R2 is the response measured for the second voltage setting Vop2.

Finally, the Vob is set to a value equal to a fixed offset less than the newly estimated Vb 212, where the fixed offset in the embodiment of FIG. 2 is 40 Volts, and the method is iterated 206-212 until the calculated Vop changes by less than 5 volts 214, or until a maximum of 5 iterations is reached, or both (depending on the embodiment). In similar embodiments, other convergence criteria and/or other maximum numbers of iterations apply.

In the embodiment of FIG. 2, the Vop is set to an offset of 40 volts below the estimated breakdown voltage Vb. In various embodiments, this offset of 40 volts is applied under "night" conditions, where there is no sunlight and little background light "noise." Table 1 lists offset voltages used in embodiments under various light conditions, where VopBW is the minimum Vop which will meet the timing (bandwidth) requirement for characterizing and adjusting the operating voltage (Vop) of the APD(s). In embodiments, VopBW is estimated according to the ambient temperature and to data supplied by the manufacturer and/or other data which is applicable to the general type of APD which is being calibrated.

TABLE 1

| Mode | Vop |
|---|---|
| No Sun Background (Night) | Vb - 40 |
| Normal Sun Background (Day) | Vb - 80 |
| Partial Sun In FOV | VopBW |
| Full Sun In FOV | VopBW |

Figure 3:
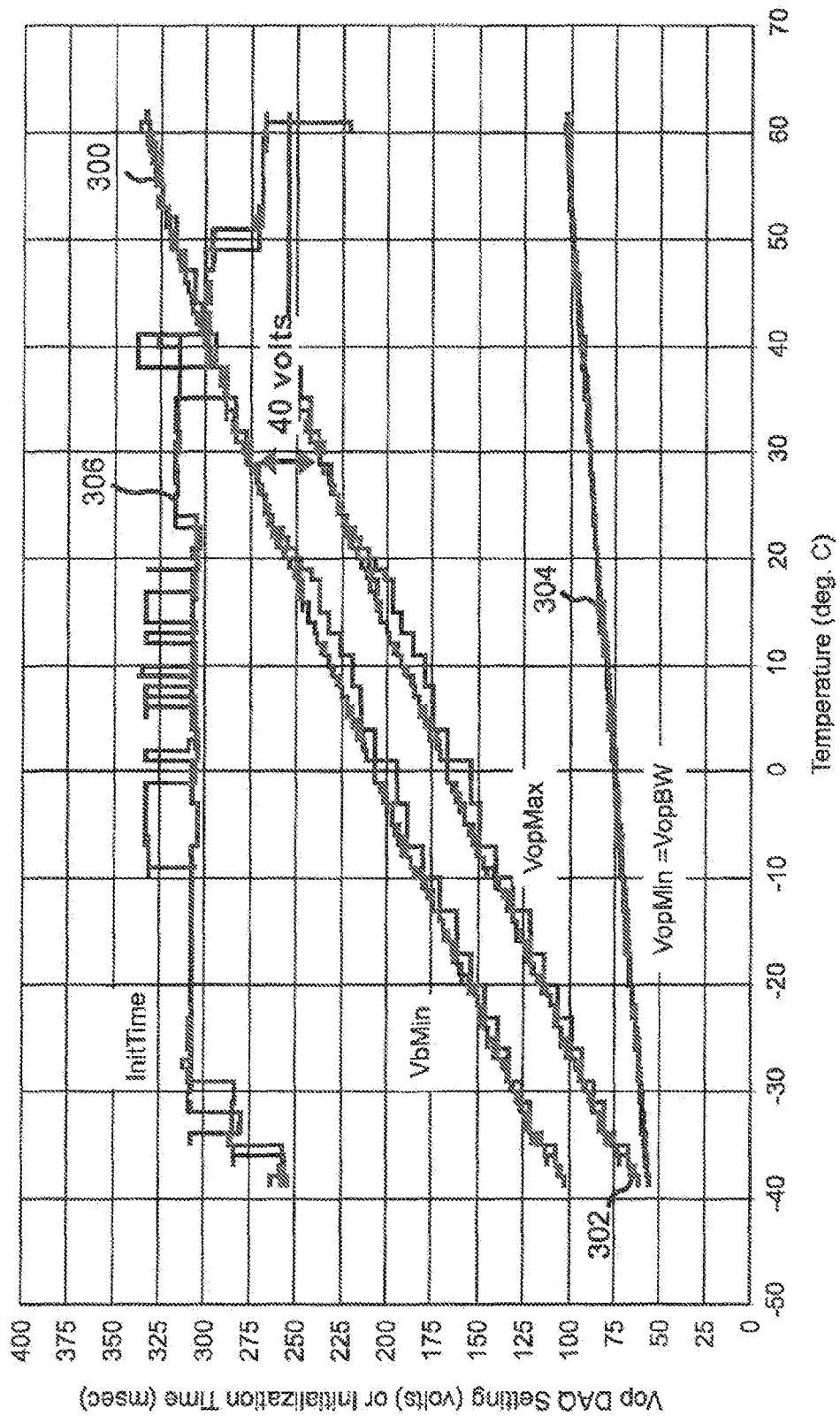
FIG. 3 presents graphical test results of APD characteristics determined using an embodiment of the present invention under night conditions.
Figure 4:
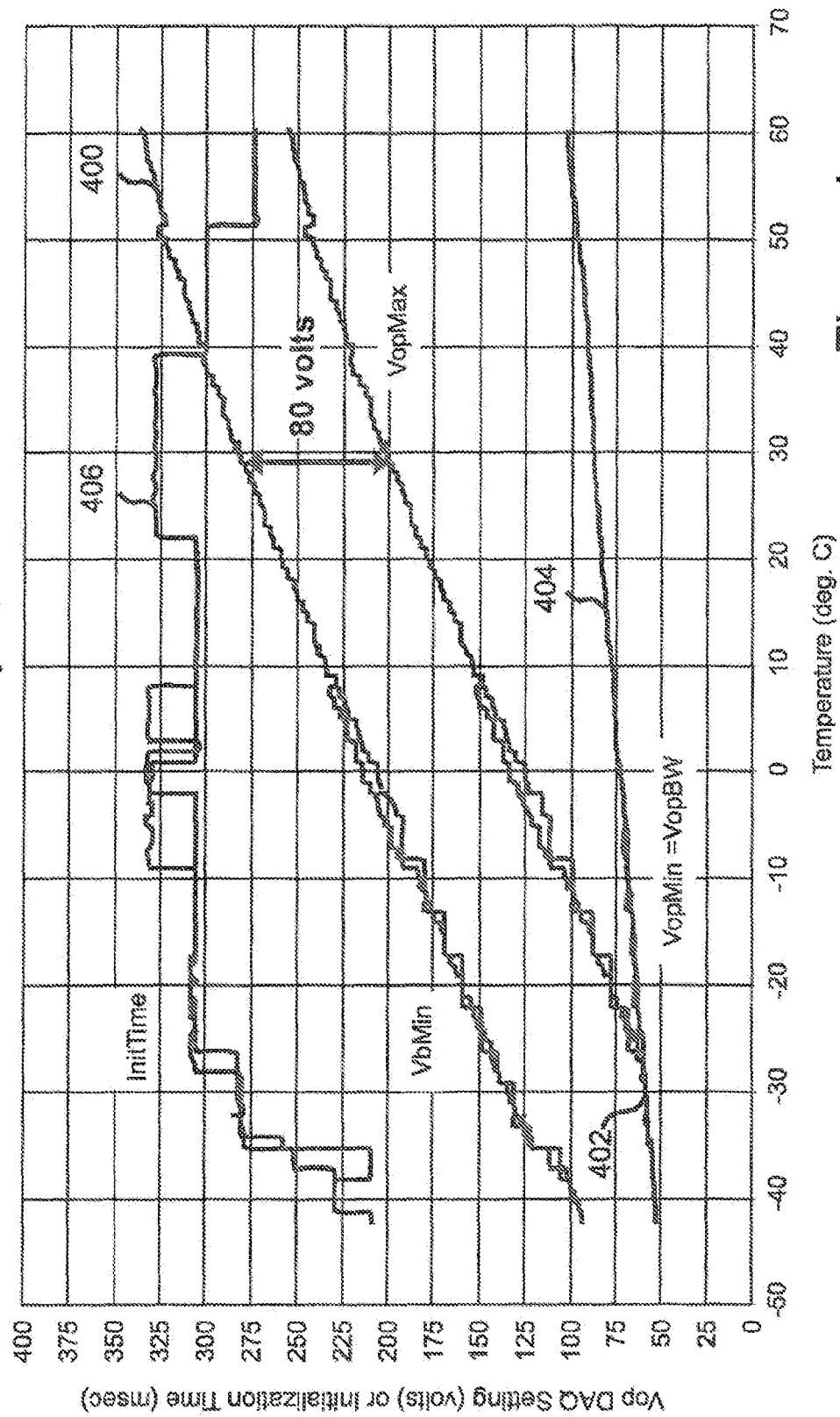
FIG. 4 presents graphical test results of APD characteristics determined using the embodiment of FIG. 3 under day conditions (sun not in field of view).

FIG. 3 presents data comparing the minimum breakdown voltage VbMin 300 (which is equal to VopBW), the maximum operating voltage VopMax 302, the minimum operating voltage VopMin 304, and the initialization time 306 as a function of temperature for the embodiment of FIG. 2 under night conditions. FIG. 4 presents similar data comparing the minimum breakdown voltage VbMin 400, the maximum operating voltage VopMax 402. the minimum operating voltage VopMin 404, and the initialization time 406 as a function of temperature for the embodiment of FIG. 2 under "normal" day conditions (sun not in field of view).

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A method for optimizing the operating voltage Vop of an avalanche photo-diode (APD), the method comprising:
   setting Vop to a first value which is less than an initially estimated breakdown voltage for the APD;
   determining a first response of the APD to an on-board light source at the first Vop value;
   setting Vop to an updated value which is less than the initially estimated breakdown voltage and different from the previous value of Vop;
   determining an updated response of the APD to the on-board light source;
   determining an updated estimated breakdown voltage according to the updated value of Vop, the updated response, the immediately previous value of Vop, and the immediately previous response;
   setting Vop to an offset value which is offset below the updated estimated breakdown voltage by a fixed offset amount; and
   repeating the steps of determining an updated response, determining an updated estimated breakdown voltage, and setting the Vop to an offset value, until at least one of a convergence criterion is met and a maximum number of repetitions is reached, each estimated breakdown voltage being determined according to a most recently set value of Vop, a most recent response, an immediately previous value of Vop, and an immediately previous response.

2. The method of claim 1, wherein determining the updated estimated breakdown voltage Vb includes applying the formula $$Vb = (R2*Vop2 - R1*Vop1)/(R2-R1)$$

where Vop1 is the immediately previous value of Vop, R1 is the response of the APD for Vop=Vop1, Vop2 is the updated value of Vop, and R2 is the response of the APD for Vop=Vop2.

3. The method of claim 1, wherein the initially estimated breakdown voltage is estimated according to an ambient temperature and typical characteristics applicable to an APD type to which the APD belongs.

4. The method of claim 1, wherein the method further includes determining a field of view illumination status, and the fixed offset amount is determined according to the field of view illumination status.

5. The method of claim 4, wherein the field of view illumination status is selected from among a group of status conditions, the group of status conditions including at least one of:
   night;
   day, sun not in field of view;
   day, sun partially in field of view; and
   day, sun fully in field of view.

6. The method of claim 4, wherein the fixed offset amount for a field of view illumination status of "night" is about approximately 40 volts.

7. The method of claim 4, wherein the fixed offset amount for a field of view illumination status of "day, sun not in field of view" is about approximately 80 volts.

8. The method of claim 4, wherein the fixed offset amount for a field of view illumination status of "day, sun partially in field of view" is an amount which sets Vop to a minimum value VopBW below which the response of the APD might not meet a timing (bandwidth) required to evaluate laser pulses.

9. The method of claim 4, wherein the fixed offset amount for a field of view illumination status of "day, sun fully in field of view" is an amount which sets Vop to a minimum value VopBW below which the response of the APD might not meet a timing (bandwidth) required to evaluate laser pulses.

10. The method of claim 1, wherein the convergence criterion is that the difference between the updated value of Vop and the immediately previous value of Vop is less than or equal to 5 Volts in one embodiment.

11. The method of claim 1, wherein the maximum number of repetitions is 5 repetitions.

12. The method of claim 1, wherein the fixed offset is adjusted if necessary so as to ensure that Vop is not set below a minimum value VopBW necessary to meet timing requirements of the APD.

13. The method of claim 1, wherein the on-board light source is an LED.

14. The method of claim 1, wherein a common Vop is provided to each APD in a group containing a plurality of APD's, and the method further includes determining responses of each of the APD's in the group to the on-board light source and setting the Vop to a value which is optimal for performance of the group of APD's.

15. The method of claim 14, wherein determining responses of each of the APD's in the group to the on-board light source includes determining responses of each of the APD's to the same on-board light source.

16. The method of claim 14, wherein the group includes exactly seven APD's.

17. The method of claim 14, wherein setting the Vop to a value which is optimal for performance of the group of APD's includes:
   determining a most sensitive APD in the group, the most sensitive APD in the group being that APD in the group which has the lowest breakdown voltage in comparison to the other APD's in the group;
   optimizing Vop to find an optimal value VopMS for the most sensitive APD in the group; and
   setting Vop to a value which is offset from VopMS by a predetermined most-sensitive offset amount.

18. The method of claim 17, wherein setting Vop to a value which is offset from VopMS includes setting Vop to a value which is greater than a minimum value VopBW below which the updated response of the APD to the on-board light source cannot be determined within a specified maximum time period.

19. The method of claim 1, wherein the on-board light source is a pulsed light source.

* * * * *